United States Patent [19]

Shigekane

[11] Patent Number: 4,746,814

[45] Date of Patent: May 24, 1988

[54] SEMICONDUCTOR DEVICE FOR CONDUCTING PRIMARY CURRENT UPON RECEIPT OF A CONTROL SIGNAL

[75] Inventor: Hisao Shigekane, Kanagawa, Japan

[73] Assignee: Fuji Electric Company Ltd., Japan

[21] Appl. No.: 875,336

[22] Filed: Jun. 17, 1986

[30] Foreign Application Priority Data

Jun. 17, 1985 [JP] Japan .................. 60-131296

[51] Int. Cl.⁴ .................. H03K 17/60; H03K 17/687
[52] U.S. Cl. .................. 307/255; 307/570; 307/574
[58] Field of Search .................. 307/254, 255, 570–579

[56] References Cited

U.S. PATENT DOCUMENTS 4,103,186 7/1978 Albarran et al. .................. 307/570
4,360,744 11/1982 Taylor .................. 307/570
4,581,542 4/1986 Steigerwald .................. 307/570

Primary Examiner—Stanley D. Miller
Assistant Examiner—B. P. Davis
Attorney, Agent, or Firm—Stevens, Davis, Miller & Mosher

[57] ABSTRACT

A semiconductor device comprising first and second transistors connected in series with one another to pass a primary current upon receipt of a control signal at the gate of the second transistor. The first transistor is coupled to receive a base current from a secondary power source. A third transistor is coupled to have a current path shunt that base current away from the first transistor upon conduction of the third transistor. A control electrode of the third transistor is coupled to receive the control signal also received at the gate of the second transistor. The polarity of the third transistor is selected to render the third transistor conductive when the second transistor is rendered non-conductive in response to the control signal and to render the third transistor non-conductive when the second transistor is rendered conductive by the control signal. Thus, the third transistor operates to shunt base current from the first transistor upon non-conduction of the second transistor, thereby quickly turning OFF the first transistor.

7 Claims, 3 Drawing Sheets

SEMICONDUCTOR DEVICE FOR CONDUCTING PRIMARY CURRENT UPON RECEIPT OF A CONTROL SIGNAL

BACKGROUND OF THE INVENTION

I. Field of the Invention

The present invention relates to a semiconductor device comprising two transistors having primary current paths connected in series with one another and arranged to conduct primary current through those primary current paths upon receipt of a control signal.

II. Background of the Invention

FIG. 1 illustrates an example of a prior art semiconductor device. The device of FIG. 1 comprises a main bipolar transistor Q1, a field effect transistor (FET) Q2, a zener diode ZD1 and a secondary current source comprising a resistor R1 and a voltage supply $E_B$. As shown in FIG. 1, the emitter of transistor Q1 is connected to the drain of transistor Q2 to thereby couple the primary (collector/emitter) current path of transistor Q1 in series with the primary (drain/source) current path of transistor Q2. The resultant cascade connection of transistors Q1 and Q2 forms an effective composite transistor comprising transistors Q1 and Q2.

As is further shown in FIG. 1, one pole of voltage supply $E_B$ is connected to the source of transistor of Q2, while the other pole is connected to the base of transistor Q1 through resistor R1. In addition, the cathode of zener diode ZD1 is connected to the base of transistor Q1 and the anode of zener diode ZD1 is connected to the source of transistor Q2. The gate of transistor Q2 is coupled to receive a control signal $e_G$.

In operation of the prior art device of FIG. 1, a primary current $I_C$ is applied to the collector of transistor Q1 and passes through the primary (collector/emitter) current path of transistor Q1 and the primary (drain/source) current path of transistor Q2 when both transistors Q1 and Q2 are turned ON. With transistors Q1 and Q2 ON, the primary current $I_C$ may be passed through transistors Q1 and Q2 to a load (not shown) coupled to the source of transistor Q2.

The conduction of transistor Q2 is governed by the state of the control signal $e_G$ applied to the gate of transistor Q2. Control signal $e_G$ is supplied by a drive circuit (not shown) as is well known to those skilled in the art. When control signal $e_G$ is HIGH, transistor Q2 is turned ON. In this condition, a base current IB1 is supplied from voltage supply $E_B$ through resistor R1 to the base of transistor Q1, allowing transistor Q1 to also turn ON. To achieve this result, the value of voltage supply $E_B$ must be sufficiently large to drive transistor Q1 ON as transistor Q2 is turned ON by receipt of control signal $e_G$.

As transistor Q2 turns ON, the voltage $V_{DS}$ from the drain to the source of transistor Q2 (plus the base to emitter voltage drop of transistor Q1) drops below the breakdown voltage of zener diode Z1D, permitting all of base current IB1 to pass through the base of transistor Q1. When transistor Q2 is OFF, $V_{DS}$ is sufficiently high to cause all of base current IB1 to be shunted from power supply $E_B$, through zener diode Z1D, away from the base of transistor Q1. However, the base current IB1 to transistor Q1 rises sharply as transistor Q2 is turned ON due to the steep drop of voltage $V_{DS}$, and consequent non-conductance of diode Z1D, when transistor Q2 turns ON. With transistor Q2 ON, zener diode Z1D is in the OFF (non-conductive) state.

Transistors Q1 and Q2 can be turned OFF using the following process. When control signal $e_G$ is LOW, transistor Q2 is turned OFF. Since transistor Q2 is preferably a field effect transistor (FET), transistor Q2 turns OFF quickly, causing voltage $V_{DS}$ between the drain and source of transistor Q2 to rise quickly, thereby quickly turning OFF the primary current $I_C$ flowing through transistor Q2. At the same time $V_{DS}$ rises, zener diode ZD1 becomes conductive, thereby shunting secondary or base current IB1 from the base of transistor Q1, through zener diode ZD1, to the source of transistor Q2. With this shunting of base current, accumulated carriers at the base of transistor Q1 are rapidly dissipated to the source of transistor Q2, thereby rapidly turning OFF transistor Q1. As a consequence, both transistors Q1 and Q2 are rapidly turned OFF, thereby ceasing conduction of primary current IC through transistors Q1 and Q2.

The circuit of FIG. 1 is generally intended to obtain high switching speed with high voltage resistance by combining a switching element of high speed, low voltage resistance in the form of FET Q2 and a switching element of high voltage resistance in the form of bipolar transistor Q1. Although the switching speed of FET Q2 is generally greater than that of bipolar transistor Q1, the arrangement of FIG. 2 allows transistor Q1 to also be turned OFF rapidly.

In the circuit of FIG. 1, the zener diode ZD1 is operative because the voltage $V_{DS}$ between the drain and source of transistor Q2 (plus the base to emitter voltage drop of transistor Q1), at the precise moment Q2 turns OFF, assumes a higher voltage than the breakdown voltage or limit voltage for turning ON (switching rejection voltage BDVS) zener diode ZD1. Thus, at essentially the precise moment the primary current through transistor Q2 is turned OFF through operation of transistor Q2, the secondary or effective base current to transistor Q1 is shunted from the base of transistor Q1 through zener diode ZD1, thereby also turning transistor Q1 quickly OFF.

With transistors Q1 and Q2 OFF, the secondary or base current from voltage supply $E_B$ is shunted uselessly through zener diode ZD1 to the source of transistor Q2. On the other hand when transistors Q1 and Q2 are turned on, $V_{DS}$ between the drain and source of FET Q2 (plus the base to emitter voltage drop of transistor Q2) is less than the breakdown or limit voltage for zener diode ZD1 and the secondary or base current from voltage supply $E_B$ is allowed to pass into the base of transistor Q1.

The device of FIG. 1 has a disadvantage in that when transistor Q2 turns OFF and accumulated base carriers of transistor Q1 are shunted through zener diode ZD1, a considerable amount of heat is generated in zener diode ZD1 due to the high avalanche voltage of diode ZD1. Accordingly, zener diode ZD1 must comprise an expensive element which is resistant to such heat.

In view of the foregoing, an object of the present invention is to provide a semiconductor device which eliminates the need for an expensive, heat resistant zener diode of the type required by the prior art.

Additional objects and advantages of the invention will be set forth in the description which follows, and in part will be obvious from the description or may be learned by practice of the invention.

SUMMARY OF THE INVENTION

To achieve the foregoing object, and in accordance with the purpose of the invention as embodied and broadly described herein, a semiconductor device for conducting primary current upon receipt of a control signal is provided which comprises: (a) a first transistor having a control element and a primary current path; (b) a second transistor having a control element coupled to receive the control signal and having a primary current path coupled in series with the primary current path of the first transistor at a common junction of the first and second transistors, with the resultant series primary current paths coupled to receive the beforementioned primary current; (c) a secondary current source coupled to the control electrode of the first transistor; and (d) a third transistor having a control electrode also coupled to receive that control signal and having a current path coupled to shunt the secondary current from the secondary current source away from the control electrode of the first transistor upon conduction of the third transistor and corresponding nonconduction of the second transistor in response to the control signal.

Preferably, the first transistor comprises a bipolar transistor and the second transistor comprises a field effect transistor.

It is still further preferable that the third transistor actually comprise a composite transistor.

DESCRIPTION OF THE PREFERRED EMBODIMENT

Reference will now be made in detail to the present preferred embodiment of the invention as illustrated in the accompanying drawings wherein elements of like type are identified by the same symbolic notations.

Figure 1:
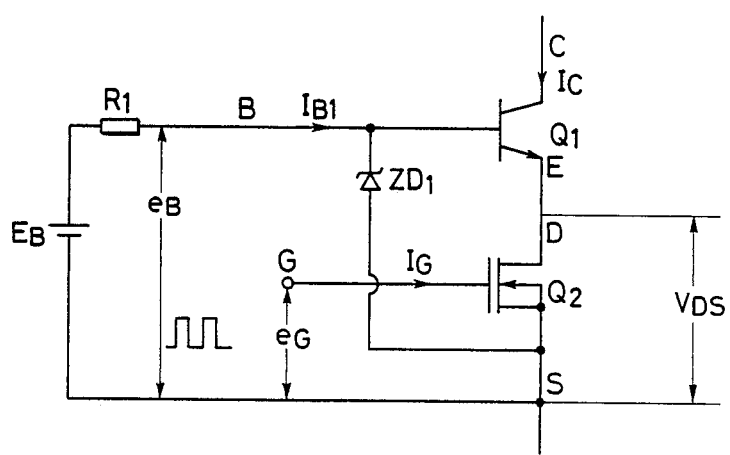
FIG. 1 is a circuit diagram of a prior art semiconductor device for conducting primary current upon receipt of a control signal.
Figure 2:
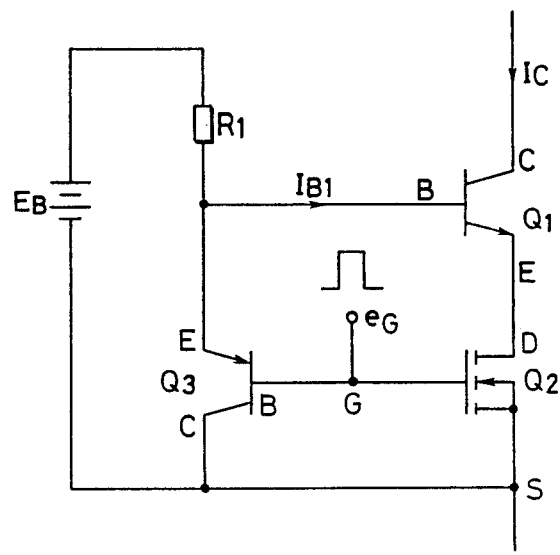
FIG. 2 is a circuit diagram of a semiconductor device for conducting primary current upon receipt of a control signal in accordance with the teachings of the subject invention.

In FIG. 2 there is illustrated a semiconductor device comprising a bipolar transistor Q1, a field effect transistor Q2, a resistor R1, a voltage supply $E_B$ and a transistor Q3. Transistor Q1 is preferably a bipolar transistor whereas transistor Q2 is preferably a field effect transistor, although transistor Q2 may in the alternative also comprise a bipolar transistor. Transistors Q1 and Q2 are coupled in the same manner as described above with regard to FIG. 1. Thus, in FIG. 2 a primary current path of transistor Q1 comprising the emitter to base current path of transistor Q1 is coupled in series with the primary current path of transistor Q2 comprising the drain/source current path of transistor Q2. The current paths of transistors Q1 and Q2 are coupled together at a common junction point, namely the drain D of transistor Q2.

Voltage supply $E_B$, in combination with resistor R1, provides a secondary current source which is coupled to the control or base electrode of transistor Q1 to provide secondary or base current to transistor Q1.

In accordance with the teachings of the subject invention, a third transistor is provided having a control electrode coupled to receive the control signal and having a current path coupled to shunt the secondary current from the secondary current source away from the control electrode of the first transistor upon conduction of the third transistor and corresponding nonconduction of the second transistor in response to the control signal.

As illustrated in FIG. 2, a PNP type auxiliary transistor Q3 is provided having a control electrode or base (B) and a current path comprising a collector (C)/emitter (E) path. The emitter of transistor Q3 is coupled to the base of transistor Q1, the collector of transistor Q3 is coupled to the source of transistor Q2 and the base of transistor Q3 is coupled to the gate of transistor Q1 and is thereby also coupled to receive control signal $e_G$. Thus, the base of auxiliary transistor Q3 is driven by the common ON-OFF signal $e_G$ as is the gate G of transistor Q2.

In operation of the circuit of FIG. 2, when control signal $e_G$ is HIGH, transistor Q2 is ON and the auxiliary transistor Q3 turns OFF because the base to emitter voltage of transistor Q3 is reduced to zero or even reversely biased. With transistor Q3 turned OFF, a base current IB1 from power supply $E_B$ is effectively delivered to the base of transistor Q1. As a consequence, the composite transistors Q1, Q2 quickly turn ON upon receipt of the HIGH control signal $e_G$. In this regard, it is to be assumed that the HIGH level of control signal $e_G$ is equal to at least the level of power supply $E_B$.

When the control signal $e_G$ becomes LOW, transistor Q2 turns OFF and the PNP auxiliary transistor Q3 turns ON. With transistor Q3 turned ON, base current IB1 from power supply $E_B$ is shunted away from the base of transistor Q1 through the emitter/collector path of auxiliary transistor Q3 to the source of transistor Q2. Simultaneously, accumulated base carriers of transistor Q1 are dissipated through the emitter/collector path of transistor Q3 and the resultant composite transistors Q1, Q2 are thereby quickly turned OFF.

In the device of FIG. 2, auxiliary transistor Q3 effectively replaces zener diode Z1 of prior art device of FIG. 1. In the device of FIG. 2, the collector/emitter voltage VCD (saturated) of transistor Q3 which exists when transistor Q3 is ON is significantly lower than the avalanche voltage of zener diode ZD1 of FIG. 1. Thus, the heat generated in transistor Q3 when transistor Q3 is ON is significantly lower than the heat generated in zener diode ZD1 when zener diode ZD1 is used to shunt base current IB1 away from the base of transistor Q1.

Figure 3:
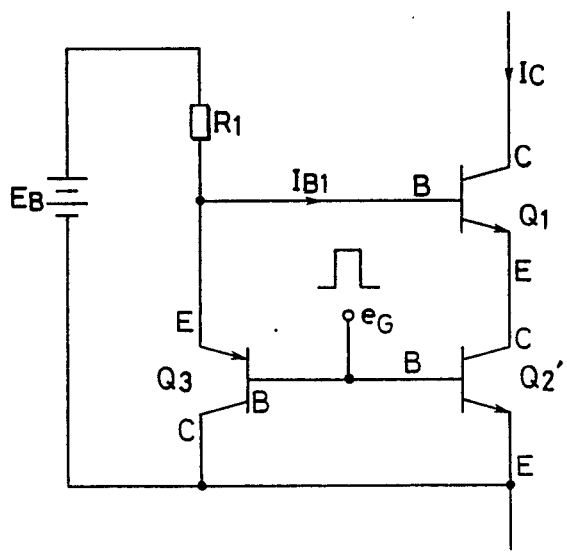
FIG. 3 is a circuit diagram of an alternative embodiment of the circuit illustrated in FIG. 2.

The semiconductor device of FIG. 3 is essentially the same as that of FIG. 2, except that the field effect transistor Q2 of FIG. 2 is replaced in FIG. 3 with a bipolar transistor Q2'.

Figure 4:
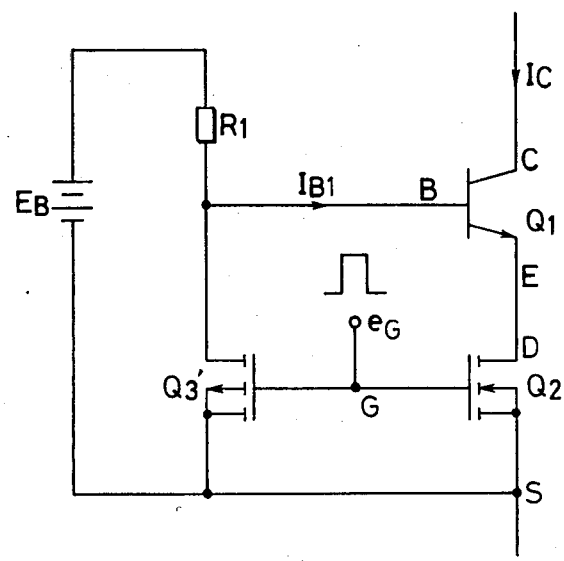
FIG. 4 is a circuit diagram of another alternative embodiment of the circuit illustrated in FIG. 2.

The semiconductor device of FIG. 4 is essentially the same as that of FIG. 2, except that the bipolar transistor Q3 of FIG. 2 is replaced in FIG. 4 with a field effect transistor Q3'.

Figure 5:
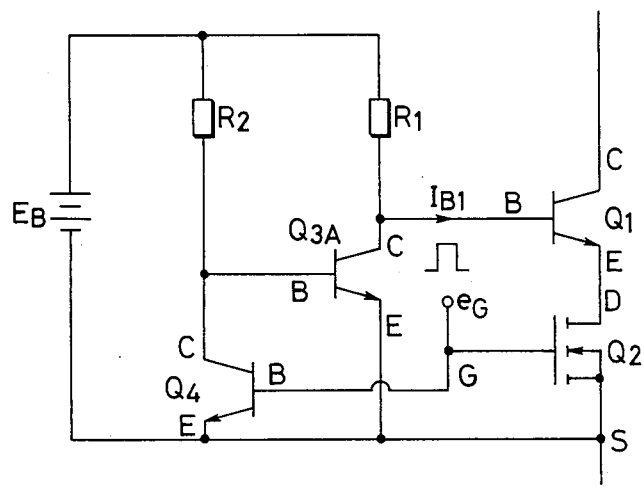
FIG. 5 is a circuit diagram of still another alternative embodiment of the circuit illustrated in FIG. 2.

The semiconductor device of FIG. 5 is essentially the same as that of FIG. 2, except that the bipolar transistor Q3 of FIG. 2 is replaced in FIG. 5 with a composite transistor comprising two NPN auxiliary transistors Q3A and Q4. In the device of FIG. 5, the collector of transistor Q3A is coupled to the base of transistor Q1 and the emitter of transistor Q3A is coupled to the source of transistor Q2. The collector of transistor Q4 is coupled to power supply $E_B$ through a resistor R2 while the emitter of transistor Q4 is coupled to the source of transistor Q2. The base of transistor Q3A is coupled to the junction of resistor R2 and the collector of transistor Q4 while the base of transistor Q4 is coupled to the gate of transistor Q2 and is thereby also coupled to receive the control signal $e_G$.

In the circuit of FIG. 5 when the ON-OFF control signal $e_G$ is HIGH, namely when composite transistors Q1 and Q2 are both ON, auxiliary transistor Q4 is also ON, thereby driving the base of auxiliary transistor Q3A to the same potential as the emitter of auxiliary transistor Q3A, forcing transistor Q3A to be OFF. In this condition, the base current IB1 from power supply $E_B$ is available to the base B of transistor Q1 permitting both transistors Q1 and Q2 to be ON.

When control voltage $e_G$ goes LOW, rendering composite transistors Q1 and Q2 OFF, auxiliary transistor Q4 is also turned OFF through operation of control signal $e_G$. With auxiliary transistor Q4 OFF, the base of auxiliary transistor Q3A is raised above the emitter of auxiliary transistor Q3A, rendering auxiliary transistor Q3A ON due to the resultant base current supplied from power source $E_B$ through resistor R2. With auxiliary transistor Q3A ON, the base of transistor Q1 is effectively shorted to the source of transistor Q2, thereby shunting base current IB1 from the base of transistor Q1 to the source of transistor Q2, quickly turning transistor Q1 OFF as was discussed above. Thus, auxiliary transistors Q3A and Q4 of FIG. 5 operate in essentially the same manner as auxiliary transistor Q3 of FIG. 2.

As noted above with regard to FIG. 3, field effect transistor Q2 may be replaced with a bipolar transistor, such as bipolar transistor Q2' of FIG. 3. In addition, auxiliary bipolar transistors Q3 and Q3A may be replaced with corresponding field effect transistors.

In summary, a semiconductor device is provided in which the emitter of a first bipolar transistor is coupled to the drain (collector) of a second field effect or bipolar transistor, and the collector/emitter (drain/source) of a third bipolar or field effect transistor are connected, in place of the prior art conventional zener diode, between the base of the first transistor and the source (emitter) of the second transistor in such a polarity so as to shunt base current from the first transistor upon conduction of the third transistor. The base (gate) of the third transistor is driven through a control signal which is also used to drive the gate (base) of the second transistor. This may be precisely the same control signal applied to both the third and second transistors, or may be a corresponding control signal synchronized with the control signal applied to the second transistor. In any event, the third transistor is turned OFF while the second transistor is turned ON and the third transistor is turned ON when the second transistor is turned OFF.

As a consequence of the foregoing, the semiconductor device of the subject invention reduces the large heat loss which is generated in the corresponding prior art zener diode and yet maintains a relatively simple and economic circuit structure. Moreover, since the base voltage of the first transistor is smaller than that provided by the prior art zener diode when the first transistor is OFF, fast switching speed of the first and second composite transistors can be realized.

I claim:
1. A semiconductor device for conducting primary current upon receipt of a control signal comprising:
   (a) a first transistor having a control electrode and a primary current path;
   (b) a second transistor having a control electrode for receiving said control signal and having a primary current path coupled in series with said primary current path of said first transistor at a common junction of said first and second transistors, the resultant series connected primary current paths also coupled to receive said primary current;
   (c) a secondary current source coupled to said control electrode of said first transistor;
   (d) a third transistor having a control electrode and having a current path coupled to shunt secondary current from said secondary current source away from said control electrode of said first transistor upon conduction of said third transistor; and
   (e) a fourth transistor having a control electrode coupled to receive said control signal and having a current path coupled to conduct current from said secondary current source upon conduction of said fourth transistor and upon corresponding conduction of said second transistor in response to said control signal, said control electrode of said third transistor coupled at the junction of said secondary current source and said current path of said fourth transistor, said fourth transistor having a polarity to render said fourth transistor non-conductive in response to said control signal rendering said second transistor non-conductive and said third transistor having a polarity to render said third transistor conductive in response to non-conduction of said fourth transistor to thereby shunt said secondary current away from said control electrode of said first transistor upon non-conduction of said second transistor.

2. A semiconductor device of claim 1 wherein said first transistor comprises a bipolar transistor.

3. A semiconductor device of claim 2 wherein said second transistor comprises a bipolar transistor.

4. A semiconductor device of claim 2 wherein said second transistor comprises a field effect transistor.

5. A semiconductor device for conducting primary current upon receipt of a control signal comprising:
   (a) a first bipolar transistor having a collector, emitter and base;
   (b) a second field effect transistor having a gate coupled to receive said control signal and having a drain and source, said drain of said second transistor coupled to said emitter of said first transistor and said collector of said first transistor coupled to receive said primary current;
   (c) a secondary current source coupled to said base of said first transistor; and
   (d) a third transistor comprising a composite transistor having a control electrode coupled to receive said control signal, a first current path electrode connected to the base of said first transistor and a second current path electrode connected to the source of said second transistor, said third transistor having a polarity to render said third transistor conductive upon non-conductance of said second transistor.

6. The semiconductor device of claim 5 wherein said third transistor comprises a bipolar transistor having a base forming said control electrode, an emitter forming said first current path electrode and a collector forming said second current path electrode.

7. A semiconductor device of claim 5 wherein said third transistor comprises a field effect transistor having a gate forming said control electrode, a drain forming said first current path electrode, and a source forming said second current path electrode.

* * * * *